US007613439B2

(12) United States Patent
Kavadias

(10) Patent No.: US 7,613,439 B2
(45) Date of Patent: Nov. 3, 2009

(54) PROGRAMMABLE BASEBAND FILTERS SUPPORTING AUTO-CALIBRATION FOR A MOBILE DIGITAL CELLULAR TELEVISION ENVIRONMENT

(75) Inventor: Spyridon Charalabos Kavadias, Athens (GR)

(73) Assignee: Broadcom Corporation

( * ) Notice: Subject to any disclaimer, the term of this patent is extended or adjusted under 35 U.S.C. 154(b) by 485 days.

(21) Appl. No.: 11/385,389

(22) Filed: Mar. 21, 2006

(65) Prior Publication Data

US 2007/0066249 A1   Mar. 22, 2007

Related U.S. Application Data

(60) Provisional application No. 60/717,915, filed on Sep. 16, 2005, provisional application No. 60/778,232, filed on Mar. 2, 2006.

(51) Int. Cl.
 *H04B 1/28* (2006.01)
(52) U.S. Cl. .................. 455/260; 455/266; 455/307
(58) Field of Classification Search .................. None
See application file for complete search history.

(56) References Cited

U.S. PATENT DOCUMENTS

| | | | | |
|---|---|---|---|---|
| 6,377,315 | B1 * | 4/2002 | Carr et al. ............... | 455/179.1 |
| 7,376,409 | B2 * | 5/2008 | Pan ........................ | 455/307 |
| 2006/0068740 | A1 * | 3/2006 | Yokoyama .............. | 455/302 |
| 2006/0276149 | A1 * | 12/2006 | Womac et al. .......... | 455/133 |

OTHER PUBLICATIONS

Mark Dawkins, Alison Payne Burdett and Nick Cowley, A Single-Chip Tuner for DVB-T, vol. 38, No. 8, Aug. 2003, pp. 1307-1317, IEEE Journal of Solid-State Circuits, The Institute of Electrical & Electronics Engineers, USA.

Patrick Antoine, Philippe Bauser, Hugues Beaulaton, Martin Buchholz, Declan Carey, Thierry Cassagnes, T. K. Chan, Stephane Colomines, Fionn Hurley, David T. Jobling, Niall Kearney, Aidan C. Murphy, James Rock, Didier Salle and Cao-Thong Tu, A Direct-Conversion receiver for DVB-H, vol. 40, No. 12, Dec. 2005, pp. 2536-2546, IEEE Journal of Solid-State Circuits, The Institute of Electrical & Electronics Engineers, USA.

Mobile and Portable DVB-T Radio Access, Version 1.0, Jan. 1, 2004, pp. 1-46, EICTA European Industry Association.

* cited by examiner

*Primary Examiner*—Thanh C Le
(74) *Attorney, Agent, or Firm*—McAndrews, Held & Malloy, Ltd.

(57) ABSTRACT

Methods and systems for programmable baseband filters supporting auto-calibration in a mobile digital cellular television environment are provided. Aspects of the method may include generating within a single-chip multi-band RF receiver, at least one control signal based on signal strength of a baseband frequency signal generated within the single-chip multi-band RF receiver. A bandwidth of a filter integrated within the single-chip multi-band RF receiver may be adjusted via the generated at least one control signal. The filter may be used for filtering the generated baseband frequency signal. A frequency response signal of the filter integrated within the single-chip multi-band RF receiver may be determined via a reference frequency signal. An attenuated reference frequency signal may be generated by attenuating the reference frequency signal. The attenuated reference frequency signal may be compared with the frequency response signal. The at least one control signal may be generated based on the comparison.

10 Claims, 7 Drawing Sheets

PROGRAMMABLE BASEBAND FILTERS SUPPORTING AUTO-CALIBRATION FOR A MOBILE DIGITAL CELLULAR TELEVISION ENVIRONMENT

CROSS-REFERENCE TO RELATED APPLICATIONS/INCORPORATION BY REFERENCE

This application makes reference to, claims priority to, and claims the benefit of:

U.S. Provisional Application Ser. No. 60/717,915, filed on Sep. 16, 2005; and

U.S. Provisional Application Ser. No. 60/778,232, filed on Mar. 2, 2006.

This application also makes reference to:

U.S. application Ser. No. 11/385,390 filed on Mar. 21, 2006;
U.S. application Ser. No. 11/385,423 filed on Mar. 21, 2006;
U.S. application Ser. No. 11/385,401 filed on Mar. 21, 2006;
U.S. application Ser. No. 11/385,081 filed on Mar. 21, 2006; and
U.S. application Ser. No. 11/385,101 filed on Mar. 21, 2006.

Each of the above stated applications is hereby incorporated herein by reference in its entirety.

FIELD OF THE INVENTION

Certain embodiments of the invention relate to on-chip RF tuners. More specifically, certain embodiments of the invention relate to programmable baseband filters supporting auto-calibration for a mobile digital cellular television environment.

BACKGROUND OF THE INVENTION

Broadcasting and telecommunications have historically occupied separate fields. In the past, broadcasting was largely an "over-the-air" medium while wired media carried telecommunications. That distinction may no longer apply as both broadcasting and telecommunications may be delivered over either wired or wireless media. Present development may adapt broadcasting to mobility services. One limitation has been that broadcasting may often require high bit rate data transmission at rates higher than could be supported by existing mobile communications networks. However, with emerging developments in wireless communications technology, even this obstacle may be overcome.

Terrestrial television and radio broadcast networks have made use of high power transmitters covering broad service areas, which enable one-way distribution of content to user equipment such as televisions and radios. By contrast, wireless telecommunications networks have made use of low power transmitters, which have covered relatively small areas known as "cells". Unlike broadcast networks, wireless networks may be adapted to provide two-way interactive services between users of user equipment such as telephones and computer equipment.

The introduction of cellular communications systems in the late 1970's and early 1980's represented a significant advance in mobile communications. The networks of this period may be commonly known as first generation, or "1G" systems. These systems were based upon analog, circuit-switching technology, the most prominent of these systems may have been the advanced mobile phone system (AMPS). Second generation, or "2G" systems, ushered improvements in performance over 1G systems and introduced digital technology to mobile communications. Exemplary 2G systems include the global system for mobile communications (GSM), digital AMPS (D-AMPS), and code division multiple access (CDMA). Many of these systems have been designed according to the paradigm of the traditional telephony architecture, often focused on circuit-switched services, voice traffic, and supported data transfer rates up to 14.4 kbits/s. Higher data rates were achieved through the deployment of "2.5G" networks, many of which were adapted to existing 2G network infrastructures. The 2.5G networks began the introduction of packet-switching technology in wireless networks. However, it is the evolution of third generation, or "3G" technology that may introduce fully packet-switched networks, which support high-speed data communications.

Standards for digital television terrestrial broadcasting (DTTB) have evolved around the world with different systems being adopted in different regions. The three leading DTTB systems are, the advanced standards technical committee (ATSC) system, the digital video broadcast terrestrial (DVB-T) system, and the integrated service digital broadcasting terrestrial (ISDB-T) system. The ATSC system has largely been adopted in North America, South America, Taiwan, and South Korea. This system adapts trellis coding and 8-level vestigial sideband (8-VSB) modulation. The DVB-T system has largely been adopted in Europe, the Middle East, Australia, as well as parts of Africa and parts of Asia. The DVB-T system adapts coded orthogonal frequency division multiplexing (COFDM). The OFDM spread spectrum technique may be utilized to distribute information over many carriers that are spaced apart at specified frequencies. The OFDM technique may also be referred to as multi-carrier or discrete multi-tone modulation. This technique may result in spectral efficiency and lower multi-path distortion, for example. The ISDB-T system has been adopted in Japan and adapts bandwidth segmented transmission orthogonal frequency division multiplexing (BST-OFDM). The various DTTB systems may differ in important aspects; some systems employ a 6 MHz channel separation, while others may employ 7 MHz or 8 MHz channel separations.

While 3G systems are evolving to provide integrated voice, multimedia, and data services to mobile user equipment, there may be compelling reasons for adapting DTTB systems for this purpose. One of the more notable reasons may be the high data rates that may be supported in DTTB systems. For example, DVB-T may support data rates of 15 Mbits/s in an 8 MHz channel in a wide area single frequency network (SFN). There are also significant challenges in deploying broadcast services to mobile user equipment. Because of form factor constraints, many handheld portable devices, for example, may require that PCB area be minimized and that services consume minimum power to extend battery life to a level that may be acceptable to users. Another consideration is the Doppler Effect in moving user equipment, which may cause inter-symbol interference in received signals. Among the three major DTTB systems, ISDB-T was originally designed to support broadcast services to mobile user equipment. While DVB-T may not have been originally designed to support mobility broadcast services, a number of adaptations have been made to provide support for mobile broadcast capability. The adaptation of DVB-T to mobile broadcasting is commonly known as DVB handheld (DVB-H). The broadcasting frequencies for Europe are in UHF (bands IV/V) and in the US, the 1670-1675 MHz band that has been allocated for DVB-H operation. Additional spectrum is expected to be allocated in the L-band world-wide.

To meet requirements for mobile broadcasting the DVB-H specification supports time slicing to reduce power consumption at the user equipment, addition of a 4K mode to enable network operators to make tradeoffs between the advantages of the 2K mode and those of the 8K mode, and an additional level of forward error correction on multi-protocol encapsulated data—forward error correction (MPE-FEC) to make DVB-H transmissions more robust to the challenges presented by mobile reception of signals and to potential limitations in antenna designs for handheld user equipment. DVB-H may also use the DVB-T modulation schemes, like QPSK and 16-quadrature amplitude modulation (16-QAM).

While several adaptations have been made to provide support for mobile broadcast capabilities in DVB-T, concerns regarding device size, cost, and/or power requirements still remain significant constraints for the implementation of handheld portable devices enabled for digital video broadcasting operations. For example, typical DVB-T tuners or receivers in mobile terminals may employ super-heterodyne architectures with one or two intermediate frequency (IF) stages and direct sampling of the passband signal for digital quadrature down-conversion. Moreover, external tracking and SAW filters may generally be utilized for channel selection and image rejection. Such approaches may result in increased power consumption and high external component count, which may limit their application in handheld portable devices. As a result, the success of mobile broadcast capability of DVB-T may depend in part on the ability to develop TV tuners that have smaller form factor, are produced at lower cost, and consume less power during operation. Furthermore, process and temperature variations within conventional tuners or receivers in mobile terminals result in deviation of the frequency response of analog filters used within the tuners or receivers. Such deviation of the frequency response results in deterioration of channel selection capabilities of the tuners or receivers.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for programmable baseband filters supporting auto-calibration for a mobile digital cellular television environment, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for programmable baseband filters supporting auto-calibration for a mobile digital cellular television environment. Aspects of the method may comprise generating within a single-chip multi-band RF receiver, at least one control signal based on signal strength of a baseband frequency signal generated within the single-chip multi-band RF receiver. A bandwidth of a filter integrated within the single-chip multi-band RF receiver may be adjusted via the generated at least one control signal. The filter may be used for filtering the generated baseband frequency signal. A frequency response signal of the filter integrated within the single-chip multi-band RF receiver may be determined via a reference frequency signal. An attenuated reference frequency signal may be generated by attenuating the reference frequency signal. The attenuated reference frequency signal may be compared with the frequency response signal.

The control signal may be generated based on the comparison of the attenuated reference frequency and the frequency response signal. The attenuated reference frequency signal and the frequency response signal may be averaged prior to the comparing. The filter integrated within the single-chip multi-band RF receiver may comprise a low-pass filter, such as a Chebyschev filter. A capacitance of the filter integrated within the single-chip multi-band RF receiver may be adjusted based on the generated at least one control signal. A cut-off frequency of the filter integrated within the single-chip multi-band RF receiver may be adjusted via the generated at least one control signal. For example, the cut-off frequency of the filter integrated within the single-chip multi-band RF receiver may be adjusted within the range of about 2 MHz to about 5 MHz.

Figure 1A:
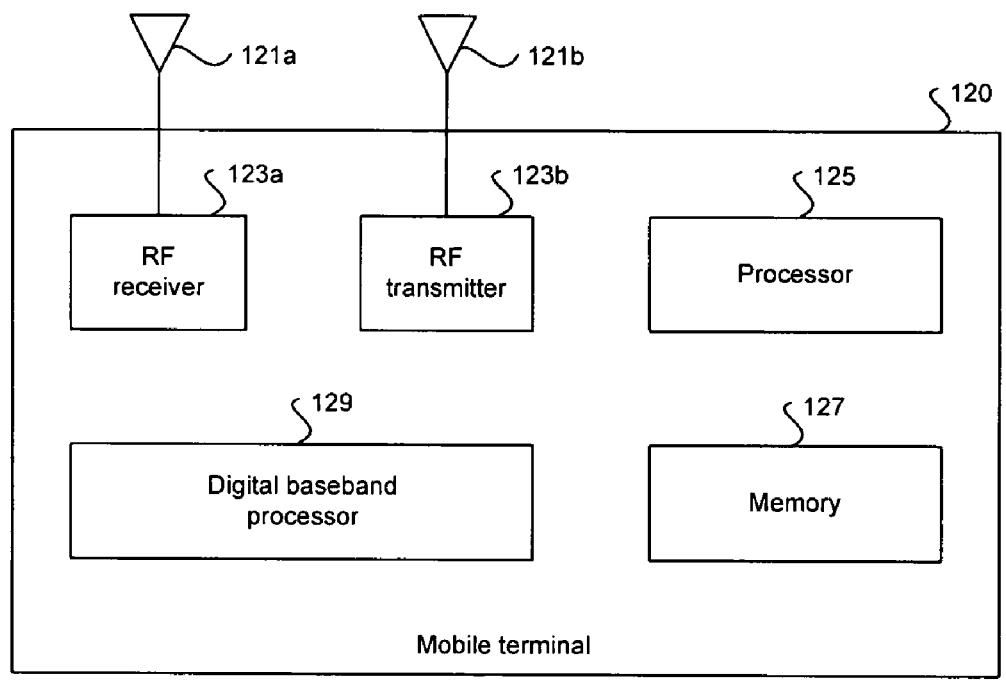
FIG. 1A is a block diagram illustrating an exemplary mobile terminal, in accordance with an embodiment of the invention.

FIG. 1A is a block diagram illustrating an exemplary mobile terminal, in accordance with an embodiment of the invention. Referring to FIG. 1A, there is shown a mobile terminal 120 that may comprise an RF receiver 123a, an RF transmitter 123b, a digital baseband processor 129, a processor 125, and a memory 127. A receive antenna 121a may be communicatively coupled to the RF receiver 123a. A transmit antenna 121b may be communicatively coupled to the RF transmitter 123b. The mobile terminal 120 may be operated in a system, such as the cellular network and/or digital video broadcast network described in FIG. 1A, for example.

The RF receiver 123a may comprise suitable logic, circuitry, and/or code that may enable processing of received RF signals. The RF receiver 123a may enable receiving RF signals in a plurality of frequency bands. For example, the RF receiver 123a may enable receiving DVB-H transmission signals via the UHF band, from about 470 MHz to about 890 MHz, the 1670-1675 MHz band, and/or the L-band, from about 1400 MHz to about 1700 MHz, for example. Moreover, the RF receiver 123a may enable receiving signals in cellular frequency bands, for example. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the mobile terminal 120 may comprise more than one RF receiver 123a, wherein each of the RF receivers 123a may be a single-band or a multi-band receiver.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network.

The RF transmitter 123b may comprise suitable logic, circuitry, and/or code that may enable processing of RF signals for transmission. The RF transmitter 123b may enable transmission of RF signals in a plurality of frequency bands. Moreover, the RF transmitter 123b may enable transmitting signals in cellular frequency bands, for example. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the mobile terminal 120 may comprise more than one RF transmitter 123b, wherein each of the RF transmitters 123b may be a single-band or a multi-band transmitter.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120. The processor 125 may also enable executing of applications that may be utilized by the mobile terminal 120. For example, the processor 125 may execute applications that may enable displaying and/or interacting with content received via DVB-H transmission signals in the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the mobile terminal 120. For example, the memory 127 may comprise information necessary to configure the RF receiver 123a to enable receiving DVB-H transmission in the appropriate frequency band.

Figure 1B:
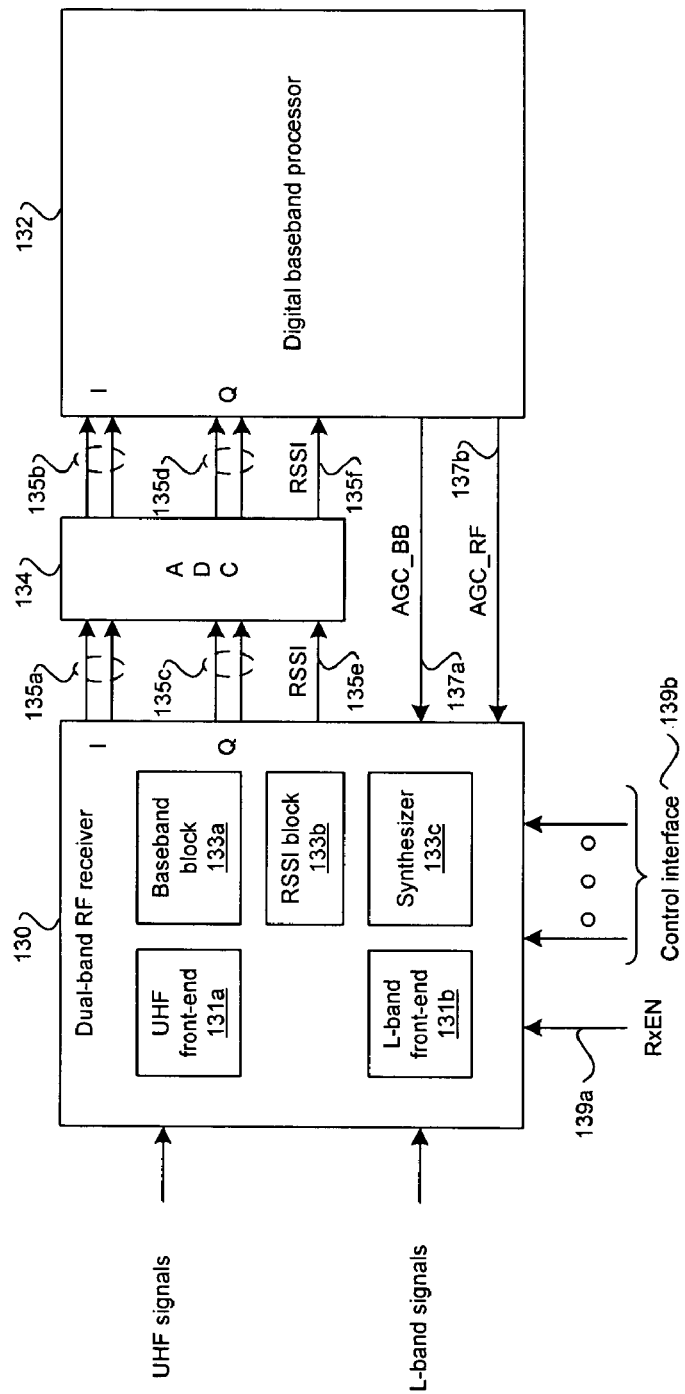
FIG. 1B is a block diagram illustrating exemplary communication between a dual-band RF receiver and a digital baseband processor in a mobile terminal, in accordance with an embodiment of the invention.

FIG. 1B is a block diagram illustrating exemplary communication between a dual-band RF receiver and a digital baseband processor in a mobile terminal, in accordance with an embodiment of the invention. Referring to FIG. 1B, there is shown a dual-band RF receiver 130, an analog-to-digital converter (ADC) 134, and a digital baseband processor 132. The dual-band RF receiver 130 may comprise a UHF front-end 131a, an L-band front-end 131b, a baseband block 133a, a received signal strength indicator (RSSI) block 133b, and a synthesizer 133c. The dual-band RF receiver 130, the analog-to-digital converter (ADC) 134, and/or the digital baseband processor 132 may be part of a mobile terminal, such as the mobile terminal 120 in FIG. 1A, for example.

The dual-band RF receiver 130 may comprise suitable logic, circuitry, and/or code that may enable handling of UHF and L-band signals. The dual-band RF receiver 130 may be enabled via an enable signal, such as the signal RxEN 139a, for example. In this regard, enabling the dual-band RF receiver 130 via the signal RxEN 139a by a 1:10 ON/OFF ratio may allow time slicing in DVB-H while reducing power consumption. At least a portion of the circuitry within the dual-band RF receiver 130 may be controlled via the control interface 139b. The control interface 139b may receive information from, for example, a processor, such as the processor 125 in FIG. 1A, or from the digital baseband processor 132. The control interface 139b may comprise more than one bit. For example, when implemented as a 2-bit interface, the control interface 139a may be an inter-integrated circuit (I2C) interface.

The UHF front-end 131a may comprise suitable logic, circuitry, and/or code that may enable low noise amplification and direct down conversion of UHF signals. In this regard, the UHF front-end 131a may utilize an integrated low noise amplifier (LNA) and mixers, such as passive mixers, for example. The UHF front-end 131a may communicate the resulting baseband frequency signals to the baseband block 133a for further processing.

The L-band front-end 131b may comprise suitable logic, circuitry, and/or code that may enable low noise amplification and direct down conversion of L-band signals. In this regard, the L-band front-end 131b may utilize an integrated LNA and mixers, such as passive mixers, for example. The L-band front-end 131b may communicate the resulting baseband frequency signals to the baseband block 133a for further processing. The dual-band RF receiver 130 may enable one of the UHF front-end 131a and the L-band front-end 131b based on current communication conditions.

The synthesizer 133c may comprise suitable logic, circuitry, and/or code that may enable generating the appropriate local oscillator (LO) signal for performing direct down conversion in either the UHF front-end 131a or the L-band front-end 131b. Since the synthesizer 133c may enable fractional division of a source frequency when generating the LO signal, a large range of crystal oscillators may be utilized as a frequency source for the synthesizer 133c. This approach may enable the use of an existing crystal oscillator in a mobile terminal PCB, thus reducing the number of external components necessary to support the operations of the dual-band RF receiver 130, for example. The synthesizer 133 may generate a common LO signal for the UHF front-end 131a and for the L-band front-end 131b. In this regard, the UHF front-end 131a and the L-band front-end 131b may enable dividing the LO signal in order to generate the appropriate signal to perform down conversion from the UHF band and from the L-band respectively. In some instances, the synthesizer 133 may have at least one integrated voltage controlled oscillator (VCO) for generating the LO signal. In other instances, the VCO may be implemented outside the synthesizer 133.

The baseband block 133a may comprise suitable logic, circuitry, and/or code that may enable processing of I/Q components generated from the direct down conversion operations in the UHF front-end 131a and the L-band front-end 131b. The baseband block 133a may enable amplification and/or filtering of the I/Q components in analog form. The baseband block 133a may communicate the processed I component, that is, signal 135a, and the processed Q component, that is, signal 135c, to the ADC 134 for digital conversion.

The RSSI block 133b may comprise suitable logic, circuitry, and/or code that may enable measuring the strength, that is, the RSSI value, of a received RF signal, whether UHF or L-band signal. The RSSI measurement may be performed, for example, after the received RF signal is amplified in either the UHF front-end 131a or the L-band front-end 131b. The RSSI block 133b may communicate the analog RSSI measurement that is, signal 135e, to the ADC 134 for digital conversion.

The ADC 134 may comprise suitable logic, circuitry, and/or code that may enable digital conversion of signals 135a, 135c, and/or 135e to signals 135b, 135d, and/or 135f respectively. In some instances, the ADC 134 may be integrated into the dual-band RF receiver 130 or into the digital baseband processor 132.

The digital baseband processor 132 may comprise suitable logic, circuitry, and/or code that may enable processing and/or handling of baseband frequency signals. In this regard, the digital baseband processor 132 may be the same or substantially similar to the digital baseband processor 129 described in FIG. 1A. The digital baseband processor 132 may enable generating at least one signal, such as the signals AGC_BB 137a and AGC_RF 137b, for adjusting the operations of the dual-band RF receiver 130. For example, the signal AGC_BB 137a may be utilized to adjust the gain provided by the baseband block 133a on the baseband frequency signals generated from either the UHF front-end 131a or the L-band front-end 131b. In another example, the signal AGC_RF 137b may be utilized to adjust the gain provided by an integrated LNA in either the UHF front-end 131a or the L-band front-end 131b. In another example, the digital baseband processor 132 may generate at least one control signal or control information communicated to the dual-band RF receiver 130 via the control interface 139b for adjusting operations within the dual-band RF receiver 130.

Figure 1C:
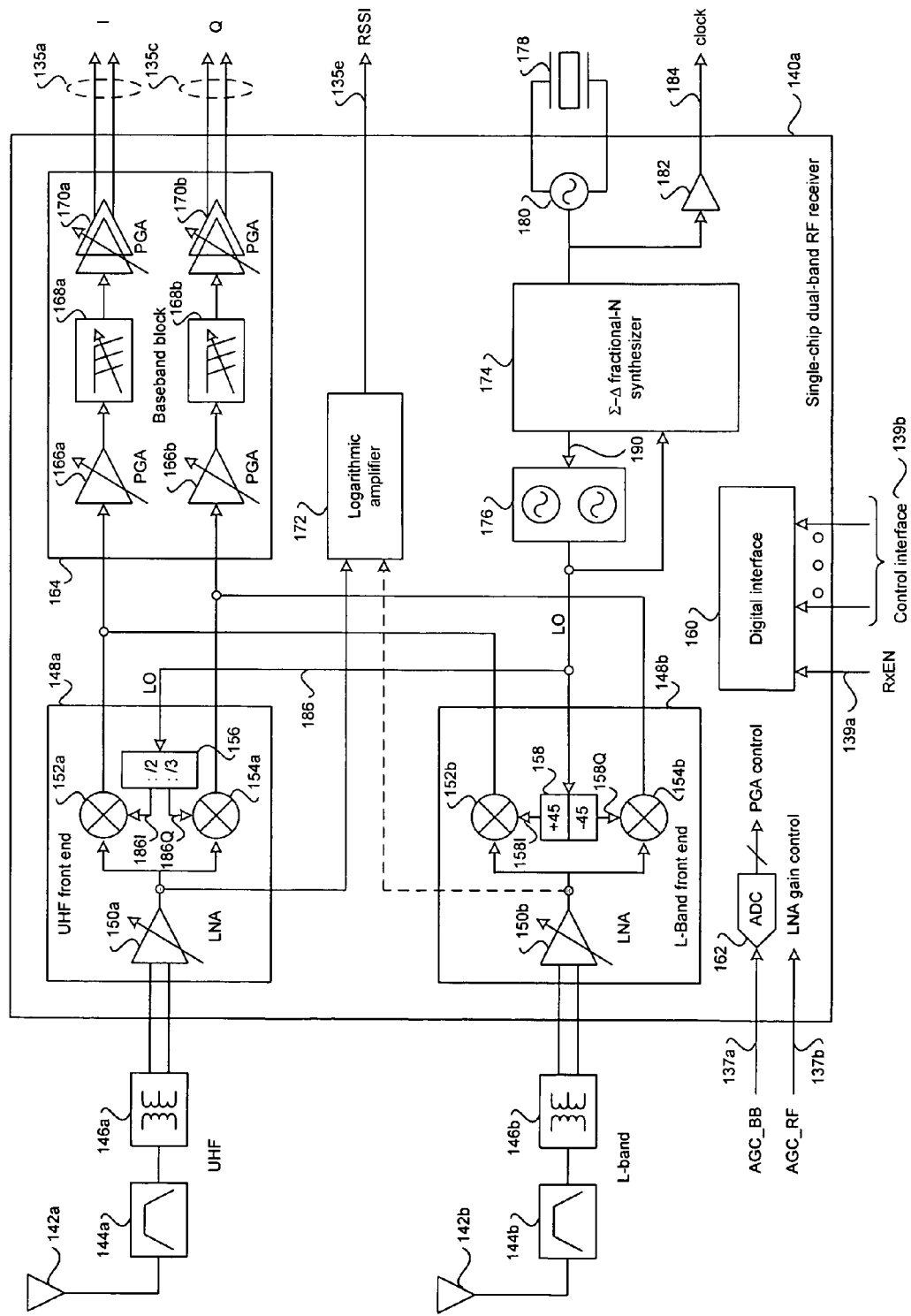
FIG. 1C is a block diagram illustrating an exemplary single-chip dual-band RF receiver with an integrated LNA in each front-end, in accordance with an embodiment of the invention.

FIG. 1C is a block diagram illustrating an exemplary single-chip dual-band RF receiver with an integrated LNA in each front-end, in accordance with an embodiment of the invention. Referring to FIG. 1C, there is shown a single-chip dual-band RF receiver 140a that may comprise a UHF front-end 148a, an L-band front-end 148b, a baseband block 164, a logarithmic amplifier (logarithmic amplifier) 172, a $\Sigma$–$\Delta$ fractional-N synthesizer 174, a VCO block 176, a digital interface 160, an ADC 162, an oscillator 180, and a buffer 182.

The single-chip dual-band RF receiver 140a may be fabricated using any of a plurality of semiconductor manufacturing processes, for example, complimentary metal-oxide-semiconductor (CMOS) processes, bipolar CMOS (BiCMOS), or Silicon Germanium (SiGe). The single-chip dual-band RF receiver 140a may be implemented using differential structures to minimize noise effects and/or substrate coupling, for example. The single-chip dual-band RF receiver 140a may utilize low drop out (LDO) voltage regulators to regulate and clean up on-chip voltage supplies. In this regard, the LDO voltage regulators may be utilized to transform external voltage sources to the appropriate on-chip voltages.

When the single-chip dual-band RF receiver 140a is implemented utilizing a CMOS process, some design considerations may include achieving low noise figure (NF) values, wide-band operation, high signal-to-noise ration (SNR), performing DC offset removal, achieving high input second-order and third-order intercept points (IIP2 and IIP3), and/or reducing I/Q mismatch, for example.

The single-chip dual-band RF receiver 140a may receive UHF signals via a first antenna 142a, a UHF filter 144a, and a first balum 146a. The UHF filter 144a enables band pass filtering, wherein the band pass may be about 470 to about 702 MHz for cellular signals, for example, or about 470 to about 862 MHz, for other types of received signals, for example. The balum 146a enables balancing the filtered signals before being communicated to the UHF front-end 148a.

The single-chip dual-band RF receiver 140a may receive L-band signals via a second antenna 142b, an L-band filter 144b, and a second balum 146b. The L-band filter 144b enables band pass filtering, wherein the band pass may be about 1670 to about 1675 MHz for signals in US systems, for example, or about 1450 to about 1490 MHz, for signals in European systems, for example. The balum 146b enables balancing the filtered signals before being communicated to the L-band front-end 148a. In some instances, antennas 142a and 142b may be implemented utilizing a single antenna communicatively coupled to the single-chip dual-band RF receiver 140a that may support receiving radio signals operating in the UHF IV/V and/or L-band, for example.

The UHF front-end 148a may comprise a variable low noise amplifier (LNA) 150a, a mixer 152a, a mixer 154a, and a LO signal divider 156. The variable LNA 150a may comprise suitable logic and/or circuitry that may enable amplification of the UHF signals received. Matching between the output of the balum 146a and the input of the variable LNA 150a may be achieved by utilizing off-chip series inductors, for example. The variable LNA 150a may implement continuous gain control by current steering that may be controlled by a replica scheme within the variable LNA 150a. The gain of the variable LNA 150a may be adjusted via the signal AGC_RF 137b, for example.

The mixers 152a and 154a may comprise suitable logic and/or circuitry that may enable generating in-phase (I) and quadrature (Q) components of the baseband frequency signal based on direct down conversion of the amplified received UHF signal with the quadrature signals 186I and 186Q generated by the divider block 156. The mixers 152a and 154a may be passive mixers in order to achieve high linearity and/or low flicker noise, for example. The LO signal divider

156 may comprise suitable logic, circuitry, and/or code that may enable dividing of the LO signal 186 by a factor of 2 (:/2) or a factor of 3 (:/3) and at the same time provide quadrature outputs 186I and 186Q, wherein 186I and 186Q have 90 degrees separation between them. The factor of 3 division may be used when the received UHF signal band is about 470 to about 600 MHz, for example. The factor of 2 division may be used when the received UHF signal band is about 600 to about 900 MHz, for example. The I/Q components generated by the mixers 152a and 154a may be communicated to the baseband block 164.

The L-band front-end 148b may comprise a variable LNA 150b, a mixer 152a, a mixer 154a, and a LO signal generator 158. The variable LNA 150a may comprise suitable logic and/or circuitry that may enable amplification of the L-band signals received. Matching between the output of the balun 146b and the input of the variable LNA 150b may be achieved by utilizing off-chip series inductors, for example. The variable LNA 150b may implement continuous gain control by current steering that may be controlled by a replica scheme within the variable LNA 150b. The gain of the variable LNA 150b may be adjusted via the signal AGC_RF 137b, for example.

The mixers 152b and 154b may comprise suitable logic and/or circuitry that may enable generating I/Q components of the baseband frequency signal based on the direct down conversion of the amplified received L-band signal with the LO signals 158I and 158Q generated by the LO generator block 158. The mixers 152b and 154b may be passive mixers in order to achieve high linearity and/or low flicker noise, for example. The LO signal generator 158 may comprise suitable logic, circuitry, and/or code that may enable generation of quadrature LO signals 158I and 158Q, that is, signals with 90 degree phase split between them, from the LO signal 186. The I/Q components generated by the mixers 152b and 154b may be communicated to the baseband block 164.

The logarithmic amplifier 172 may comprise suitable logic, circuitry, and/or code that may enable generation of a wideband, received signal strength indicator (RSSI) signal, such as the signal 135e, based on the output of the variable LNA 150a. The RSSI signal indicates the total amount of signal power that is present at the output of the LNA, for example. The RSSI signal may be utilized by, for example, the digital baseband processor 132 in FIG. 1C, to adjust the gain of the variable LNA 150a in the presence of RF interference to achieve NF and/or linearity performance that meets blocking and/or intermodulation specifications, for example. In this regard, interference may refer to blocker signals, for example. Blocker signals may be unwanted signals in frequency channels outside the wanted or desired channel that may disturb the reception of the wanted signals. This effect may be a result of blockers generating large signals within the receiver path. These large signals may introduce harmonics, intermodulation products, and/or unwanted mixing products that crosstalk with the wanted signals. In another embodiment of the invention, the logarithmic amplifier 172 may enable generating a wideband, RSSI signal, such as the signal 135e, based on the output of the variable LNA 150b. In this instance, the RSSI signal may be utilized by to adjust the gain of the variable LNA 150b.

The baseband block 164 may comprise an in-phase component processing path and a quadrature component processing path. The in-phase processing path may comprise at least one programmable gain amplifier (PGA) 166a, a baseband filter 168a, and at least one PGA 170a. The quadrature component processing path may comprise at least one PGA 166b, a baseband filter 168b, and at least one PGA 170b. The PGAs 166a, 166b, 170a, and 170b may comprise suitable logic, circuitry, and/or code that may enable amplification of the down converted components of the baseband frequency signal generated by the RF front-end. The gain of the PGAs 166a, 166b, 170a, and 170b may be digitally programmable. In addition, at the output of the PGAs 166a and 166b, a programmable pole may be utilized to reduce linearity requirements for the baseband filters 168a and 168b respectively. Since the static and time-varying DC offset may saturate the operation of the single-chip dual-band RF receiver 140a, the PGAs 166a, 166b, 170a, and 170b may utilize DC servo loops to address DC offset issues. The gain of the PGAs 166a, 166b, 170a, and/or 170b may be controlled via the AGC_BB signal 137a, for example. In this regard, the ADC 162 may be utilized to provide digital control of the PGAs 166a, 166b, 170a, and/or 170b when the AGC_BB signal 137a is an analog signal.

The baseband filters 168a and 168b may comprise suitable logic, circuitry, and/or code that may enable channel selection, for example. Channel selection may be performed by filters, such as an $N^{th}$ order lowpass Chebyschev filter implemented by active integrators in a leapfrog configuration, for example. For the correct tuning of the characteristics of the filters, an on-chip auto-calibration loop may be activated upon power-up. The auto-calibration loop may set up the corner frequency to the correct vale required to meet the requirements of the communications standard for which the receiver is designed. For DVB-T/DVB-H, the value $f_o$ of the filter response may be set to a value from 2 to 5 MHz thus supporting the different channel bandwidths of 5-8 MHz specified by DVB-T/DVB-H standards. During auto-calibration, a tone at the appropriate $f_{-3dB}$ may be generated on-chip and may be applied at the input of the baseband filters 168a and 168b for comparison with the filter output of a root-mean-squared (RMS) detector. A digitally controlled loop may be utilized to adjust the baseband filter bandwidth until the output of the baseband filter and the RMS detector are the same.

The $\Sigma-\Delta$ fractional-N synthesizer 174 may comprise suitable logic, circuitry, and/or code that may enable LO generation that may be independent of the reference crystal frequency, such as the crystal 178, for example. In this regard, the synthesizer 174 may generate a signal, such as the signal 190, for example, to control the operation of the VCO block 176 and therefore the generation of the LO signal 186. Since the synthesizer 174 may enable fractional synthesis, the single-chip dual band RF receiver 140a may utilize the same crystal utilized by other operations in the mobile terminal while maintaining fine tuning capability. The synthesizer 174 may receive a reference frequency signal from the crystal 178 via an oscillator 180, for example. The output of the oscillator 180 may also be buffered by the buffer 182 to generate a clock signal 184, for example.

The VCO block 176 may comprise suitable logic, circuitry, and/or code that may enable generating the LO signal 186 utilized by the UHF front-end 148a and the L-band front-end 148b for direct down conversion of the received RF signals. The VCO block 176 may comprise at least one VCO, wherein each VCO may have cross-coupled NMOS and PMOS devices and metal-oxide-semiconductor (MOS) varactors in an accumulation mode for tuning. In this regard, a switched varactor bank may be utilized for providing coarse tuning. The VCO block 176 may provide a range of about 1.2 to about 1.8 GHz when implemented utilizing two VCOs, for example. When more than one VCO is utilized in implementing the VCO block 176, selecting the proper VCO for generating the LO signal 186 may be based on the type of RF signal being received by the single-chip dual band RF receiver 140a.

The digital interface 160 may comprise suitable logic, circuitry, and/or code that may enable controlling circuitry within the single-chip dual band RF receiver 140a. The digital interface 160 may comprise a plurality of registers for storing control and/or operational information for use by the single-chip dual-band RF receiver 140a. The digital interface 160 may enable receiving the signal RxEN 139a that may be utilized to perform 1:10 ON/OFF ratio time slicing in DVB-H while reducing power consumption. Moreover, the digital interface 160 may enable receiving the control interface 139b from, for example, a processor, such as the processor 125 in FIG. 1A, or from the digital baseband processor 132 in FIG. 1C. The control interface 139b may comprise more than one bit. The control interface 139b may be utilized to control the synthesis operations of the synthesizer 174 and/or the filtering operations of the baseband filters 168a and 168b. The control interface 139b may also be utilized to adjust the bias of circuits within the single-chip dual-band RF receiver 140a, such as those of the variable LNAs 150a and 150b, the PGAs 166a, 166b, 170a, and 170b, and/or the baseband filters 168a and 168b, for example.

Figure 2A:
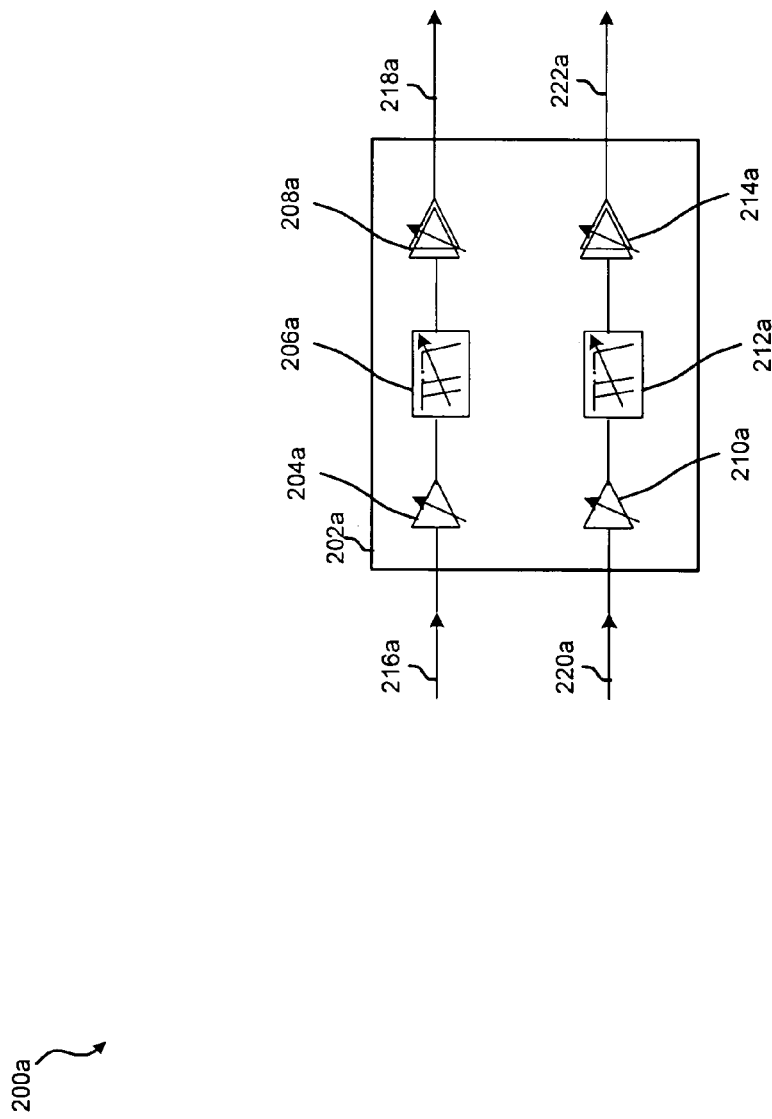
FIG. 2A is a block diagram of an exemplary analog baseband processing block supporting auto-calibration, in accordance with an embodiment of the invention.

FIG. 2A is a block diagram of an exemplary analog baseband processing block supporting auto-calibration, in accordance with an embodiment of the invention. Referring to FIG. 2A, the baseband processing block 200a may comprise a plurality of programmable gain amplifiers (PGAs) 204a, 208a, 210a, and 214a, and baseband filters 206a and 212a.

For example, the baseband processing block 200a may comprise an in-phase (I) component processing path comprising PGAs 204a and 208a, and a baseband filter 206a. The in-phase component processing path of the baseband processing block 200a may process an input in-phase (I) signal 216a to generate an output in-phase signal 218a. The input in-phase signal 216a may comprise a down converted component of a baseband frequency signal generated by an RF front end, for example. The baseband processing block 200a may also comprise a quadrature component (Q) processing path comprising PGAs 210a and 214a, and a baseband filter 212a. The quadrature component processing path of the baseband processing block 200a may process an input quadrature (Q) signal 220a to generate an output quadrature signal 222a. The input quadrature signal 220a may comprise a down converted component of a baseband frequency signal generated by an RF front end, for example.

The PGAs 204a, 208a, 210a, and 214a may comprise suitable logic, circuitry, and/or code that may enable amplification of the down converted components of the baseband frequency signals 216a and 220a. The PGAs 204a, 208a, 210a, and 214a may be digitally programmable. For example, at the output of the PGAs 204a and 210a, a programmable pole may be utilized to reduce linearity requirements for the baseband filters 206a and 212a, respectively. Furthermore, the PGAs 204a, 208a, 210a, and 214a may utilize DC servo loops to address DC offset issues. The baseband filters 206a and 212a may comprise suitable logic, circuitry, gain and/or code that may enable channel selection, for example. Channel selection may be performed by a filter bank, such as an Nth order Chebyschev filter implemented by active integrators, for example.

Figure 2B:
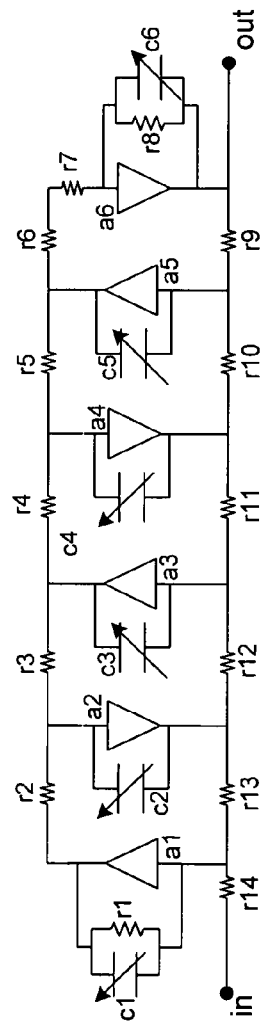
FIG. 2B is a schematic diagram of an exemplary baseband filter that may be used in accordance with an embodiment of the invention.

FIG. 2B is a schematic diagram of an exemplary baseband filter that may be used in accordance with an embodiment of the invention. Referring to FIG. 2B, the baseband filter 200b may comprise a sixth order Chebyschev filter, for example. The Chebyschev filter 200b may comprise a plurality of operational amplifiers (opamps) a1, . . . a6, a plurality of variable capacitors c1, . . . , c6, and a plurality of resistors r1, . . . , r14. In one embodiment of the invention, the opamp integrators a1-c1-r1 and a6-c6-r8 may be arranged in a leap-frog formation. Each of the capacitors c1, . . . , c6 may be implemented as a binary weighted array of capacitors that may be controlled by 6 bits, for example.

In operation, the cut-off frequency f0 of the Chebyschev filter 200b may be changed during channel selection. For example, the cut-off frequency f0 of the Chebyschev filter 200b may be set to a value from 2 MHz, for example, thereby supporting channel bandwidth of about 5 MHz to about 8 MHz, which is specified by the DVB-T standard. Even though the baseband filter 200b comprises a sixth order Chebyschev filter, the present invention may not be so limited and an Nth order low-pass filter (LPF) may be utilized instead.

Even though the baseband filter 200b is described as a Chebyschev filter, the present invention may not be so limited. Other types of filters may also be utilized, such as cascaded biquad filters, for example. Furthermore, even though operational amplifier (opamp)-RC integrators are utilized within the filter 200b, the present invention may not be so limited and other integrator implementations may also be utilized, such as a Gm-C integrator.

Figure 2C:
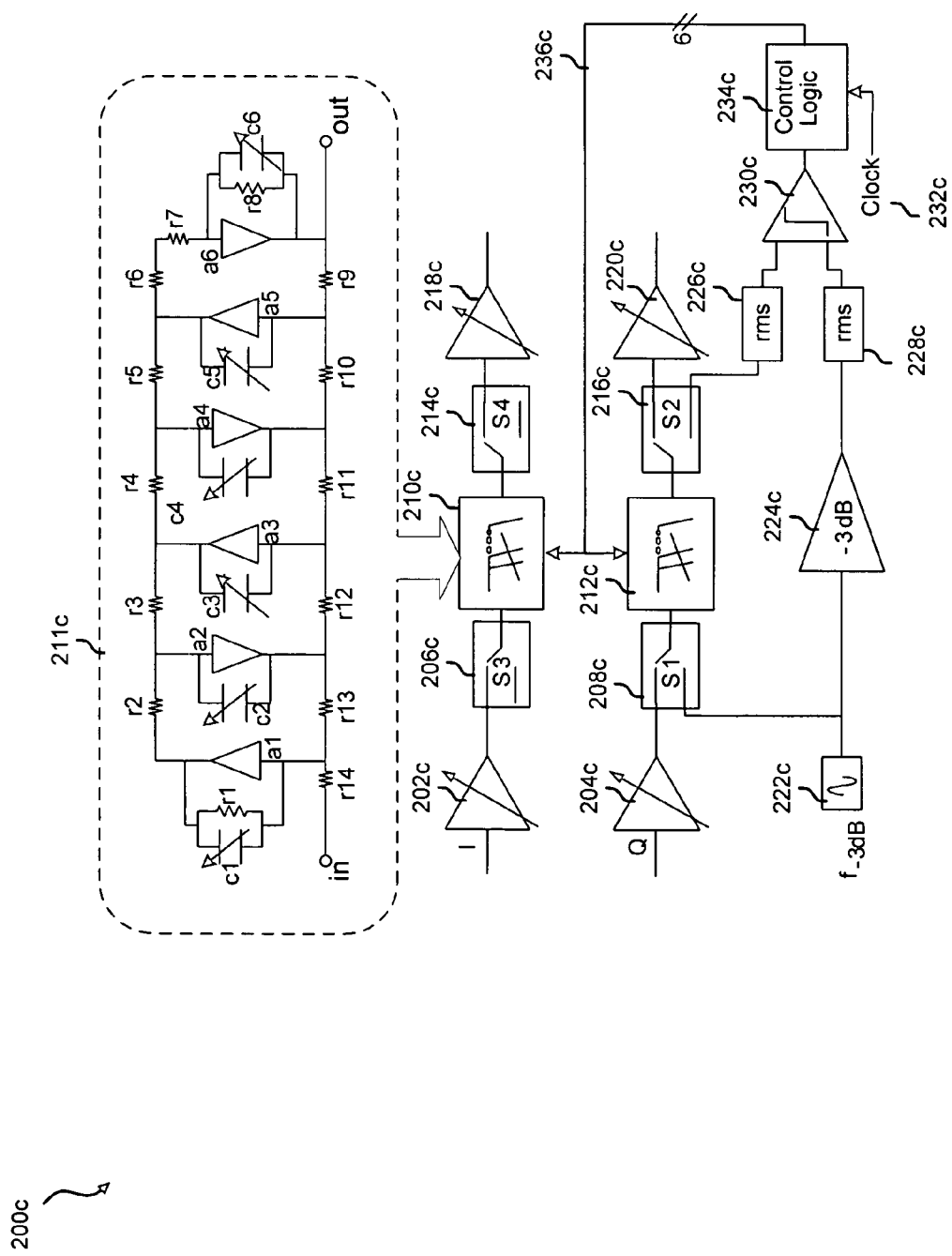
FIG. 2C is a block diagram of an exemplary baseband processing block using programmable analog (Chebyschev) filters and an auto-calibration loop, in accordance with an embodiment of the invention.

FIG. 2C is a block diagram of an exemplary baseband processing block using Chebyschev filters and an auto-calibration loop, in accordance with an embodiment of the invention. Referring to FIG. 2C, the baseband processing block 200c may comprise a plurality of programmable gain amplifiers (PGAs) 202c, 204c, 218c, and 220c, and baseband filters 210c and 212c. In addition, the baseband processing block may comprise an auto-calibration loop circuitry. The auto-calibration loop circuitry may comprise switches 206c, 214c, 208c, and 216c, frequency generator 222c, an amplifier 224c, root-means-square (rms) blocks 226c and 228c, a comparator 230c, and control logic block 234c.

Even though rms blocks are used within the baseband processing block 200c, the present invention may not be so limited and peak detectors may be used instead of the rms blocks.

The functionality of the PGAs 202c, 218c, 204c, and 220c may be similar to the functionality of the PGAs 204a, 208a, 210a, and 214a in FIG. 2A, respectively. Similarly, the functionality of the baseband filters 210c and 212c may be the same as the functionality of the baseband filters 206a and 212a in FIG. 2A, respectively. For example, the baseband filters 210c and 212c may each comprise a sixth order Chebyschev filters, such as the Chebyschev filter 211c or the Chebyschev filter 200b in FIG. 2B.

During an exemplary auto-calibration of the quadrature signal path, switches 208c and 216c may be switched to allow signal communication in the auto-calibration loop path. The frequency signal generator 222c may generate a reference frequency signal f-3 dB. The reference frequency signal may then be applied at the input of the baseband filter 212c and the amplifier 224c. The amplifier 224c may attenuate the reference frequency signal by 3 dB, for example. The attenuated frequency signal may then be communicated to the rms block 228c. After the baseband filter 212c filters the reference frequency signal communicated from the frequency signal generator 222c, the filtered reference frequency signal may be communicated to the rms block 226c.

Even though the frequency signal generator 222c generates a reference frequency signal f-3 dB that corresponds to a cut-off frequency of a main signal attenuated by 3 dB, the present invention may not be so limited. In this regard, the frequency signal generator 222c may generate a reference frequency signal f-xdB that corresponds to a cut-off frequency of a main signal attenuated by xdB. In such instances, the amplifier 224c may attenuate the signal generated by the signal generator 222c by x dB.

The rms blocks 226c and 228c may perform an averaging function, for example, on the filtered reference frequency signal and the attenuated reference frequency signal, respectively. The averaged filtered reference frequency signal and the attenuated reference frequency signal may be compared by the comparator 230c. A comparator output signal may be communicated from the comparator 230c to the control logic block 234c. The control logic block 234c may comprise suitable circuitry, logic, and/or code and may enable generation of a control signal 236c. The control logic block 234c may use a clock signal 232c during the control signal generation. In one exemplary embodiment of the invention, if a sixth order Chebyschev filter is used within the baseband processing block 200c, the control signal 236c may comprise a 6-bit signal. In this regard, six bits may be used to program or adjust the capacitance of each variable capacitor $c1, \ldots, c6$ in the filter 211c.

The control signal 236c may be communicated to each of the baseband filters 210c and 212c. The baseband filters 210c and 212c may adjust capacitance of the variable capacitors within the filters and, thereby, change the cut-off frequency and the filter bandwidth. The cut-off frequency and filter bandwidth of the filters 210c and 212c may be adjusted until attenuation of the reference frequency signal by the filter 212c equals 3 dB, for example.

Even though an auto-calibration loop is described with respect to the quadrature signal path of the baseband processing block 200c, the same auto-calibration loop circuitry, such as the reference frequency generator 222c, amplifier 224c, rms blocks 226c and 228c, comparator 230c and control logic block 234c, may be used with regard to the in-phase signal path of the baseband processing block 200c.

In one embodiment of the invention, for DVB-T applications, for example, an on-chip auto-calibration loop may be activated within the baseband processing block 200c upon power-up. The auto-calibration loop may adjust the cut-off frequency f0 of the filter response of baseband filters 210c and 212c to a value from about 2 MHz to about 5 MHz, for example. In this regard, the baseband processing block 200c may support a plurality of channel bandwidths of 5-8 MHz, such as bandwidths specified by the DVB-T standard.

Figure 2D:
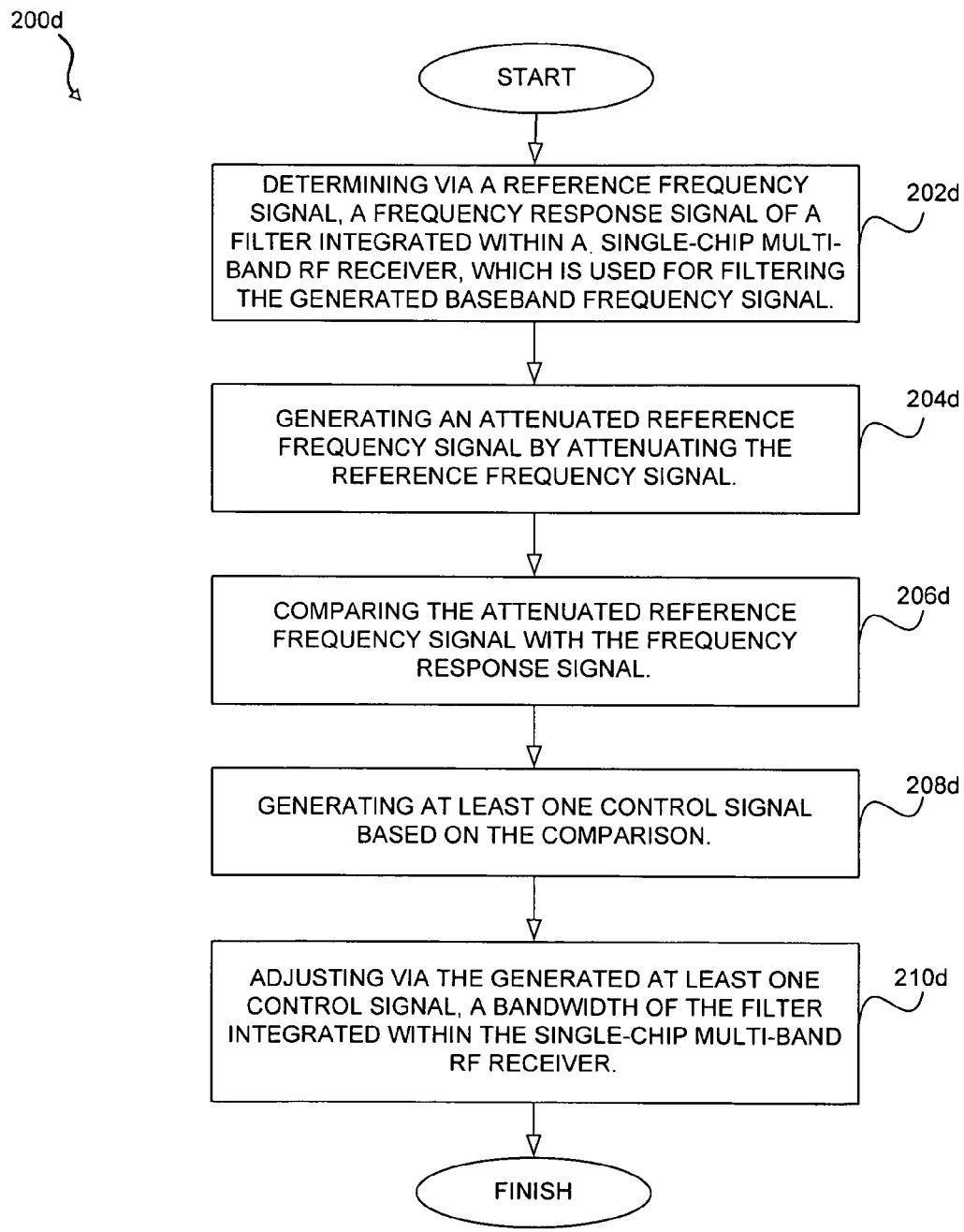
FIG. 2D is a flow diagram illustrating exemplary steps in the operation of a filter supporting auto-calibration mode, in accordance with an embodiment of the invention.

FIG. 2D is a flow diagram illustrating exemplary steps in the operation of a filter supporting auto-calibration mode, in accordance with an embodiment of the invention. Referring to FIGS. 2C and 2D, at 202d, a frequency response signal of the filter 212c may be determined using a reference frequency signal generated by the reference frequency signal generator 222c. At 204d, the amplifier 224c may generate an attenuated reference frequency signal. The comparator 230c may compare the frequency response signal generated by the filter 212c and the attenuated reference frequency signal. At 208d, the control logic block 234c may generate a control signal 236c based on the comparison of the frequency response signal generated by the filter 212c and the attenuated reference frequency signal. At 210d, the bandwidth of the filter 212c may be adjusted using the generated control signal 236c.

It should be recognized that although a single-chip dual-band RF receiver is illustrated, for example in FIG. 1C, the invention is not limited in this regard. Accordingly, the principles disclosed may be applied to a single-chip n-band RF receiver, where n is greater than 2. For example, coverage for a third band may be provided utilizing a single-chip tri-band RF receiver. Furthermore, coverage for a fourth band may be provided utilizing a single-chip quad-band RF receiver, and so on.

Accordingly, aspects of the invention may be realized in hardware, software, firmware and/or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing wireless information, the method comprising:
   generating within a single-chip multi-band RF receiver, at least one control signal based on a signal strength of a baseband frequency signal generated within said single-chip multi-band RF receiver;
   adjusting via said generated at least one control signal, a bandwidth of a filter integrated within said single-chip multi-band RF receiver, said filter being used for filtering said generated baseband frequency signal; and
   determining via a reference frequency signal, a frequency response signal of said filter integrated within said single-chip multi-band RF receiver.

2. The method according to claim 1, comprising generating an attenuated reference frequency signal by attenuating said reference frequency signal.

3. The method according to claim 2, comprising comparing said attenuated reference frequency signal with said frequency response signal.

4. The method according to claim 3, comprising generating said at least one control signal based on said comparison.

5. The method according to claim 3, comprising averaging said attenuated reference frequency signal and said frequency response signal prior to said comparing.

6. A system for processing wireless information, the system comprising:
   a single-chip multi-band radio frequency (RF) receiver that enables generation within said single-chip multi-band RF receiver, of at least one control signal based on a signal strength of a baseband frequency signal generated within said single-chip multi-band RF receiver;

said single-chip multi-band RF receiver enables adjusting via said generated at least one control signal, of a bandwidth of a filter integrated within said single-chip multi-band RF receiver, said filter being used for filtering said generated baseband frequency signal; and said single-chip multi-band RF receiver enables determining via a reference frequency signal, of a frequency response signal of said filter integrated within said single-chip multi-band RF receiver.

7. The system according to claim 6, wherein said single-chip multi-band RF receiver enables generation of an attenuated reference frequency signal by attenuating said reference frequency signal.

8. The system according to claim 7, wherein said single-chip multi-band RF receiver enables comparing of said attenuated reference frequency signal with said frequency response signal.

9. The system according to claim 8, wherein said single-chip multi-band RF receiver enables generation of said at least one control signal based on said comparison.

10. The system according to claim 8, wherein said single-chip multi-band RF receiver enables averaging of said attenuated reference frequency signal and said frequency response signal prior to said comparing.

* * * * *

UNITED STATES PATENT AND TRADEMARK OFFICE
CERTIFICATE OF CORRECTION

PATENT NO. : 7,613,439 B2
APPLICATION NO. : 11/385389
DATED : November 3, 2009
INVENTOR(S) : Spyridon Charalabos Kavadias It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 712 days.

Signed and Sealed this

Nineteenth Day of October, 2010

David J. Kappos
*Director of the United States Patent and Trademark Office*